United States Patent [19]

Vry et al.

[11] Patent Number: 5,185,643
[45] Date of Patent: Feb. 9, 1993

[54] ARRANGEMENT FOR OPERATING A LASER DIODE

[75] Inventors: Uwe Vry; Andreas Dorsel, both of Aalen; Berthold Schierle, Bopfingen; Martin Blumentritt, Königsbronn; Peter Greve, Essingen, all of Fed. Rep. of Germany

[73] Assignee: Carl-Zeiss-Stiftung, Heidenheim, Fed. Rep. of Germany

[21] Appl. No.: 804,060

[22] Filed: Dec. 9, 1991

[30] Foreign Application Priority Data

Dec. 10, 1990 [DE] Fed. Rep. of Germany ....... 4039371

[51] Int. Cl.$^5$ ..................... G01B 11/02; H01S 3/133
[52] U.S. Cl. ................................. 356/358; 250/205; 372/32
[58] Field of Search ................ 356/345, 352, 358; 250/205; 372/32

[56] References Cited

U.S. PATENT DOCUMENTS 4,583,228 4/1986 Brown et al. ..................... 372/32

FOREIGN PATENT DOCUMENTS 3542090 7/1987 Fed. Rep. of Germany .

OTHER PUBLICATIONS

"Wavelength Control of a Diode Laser for Distance Measuring Interferometry" by F. Crosdale et al., SPIE, vol. 1219, Laser–Diode Technology Applications II (1990), pp. 490 to 503.

Primary Examiner—Vincent P. McGraw
Attorney, Agent, or Firm—Walter Ottesen

[57] ABSTRACT

The invention is directed to an arrangement for operating a laser diode. A two-stage stabilization circuit is provided for stabilizing the wavelength of a laser diode to exactly defined values for its use in distance measuring interferometers. In addition to presetting the operating parameters of current and temperature of the laser diode, the emitted wavelength of the laser diode is controlled to a predetermined transmission maximum of a Fabry-Perot interferometer. At switch-on, a control program can be called up and compute new values for the operating parameters premised on the last measured values of the operating parameters and initially determined and stored coefficients. In this way, the program always reliably sets the wavelength of the laser diode to the same transmission maximum.

10 Claims, 4 Drawing Sheets

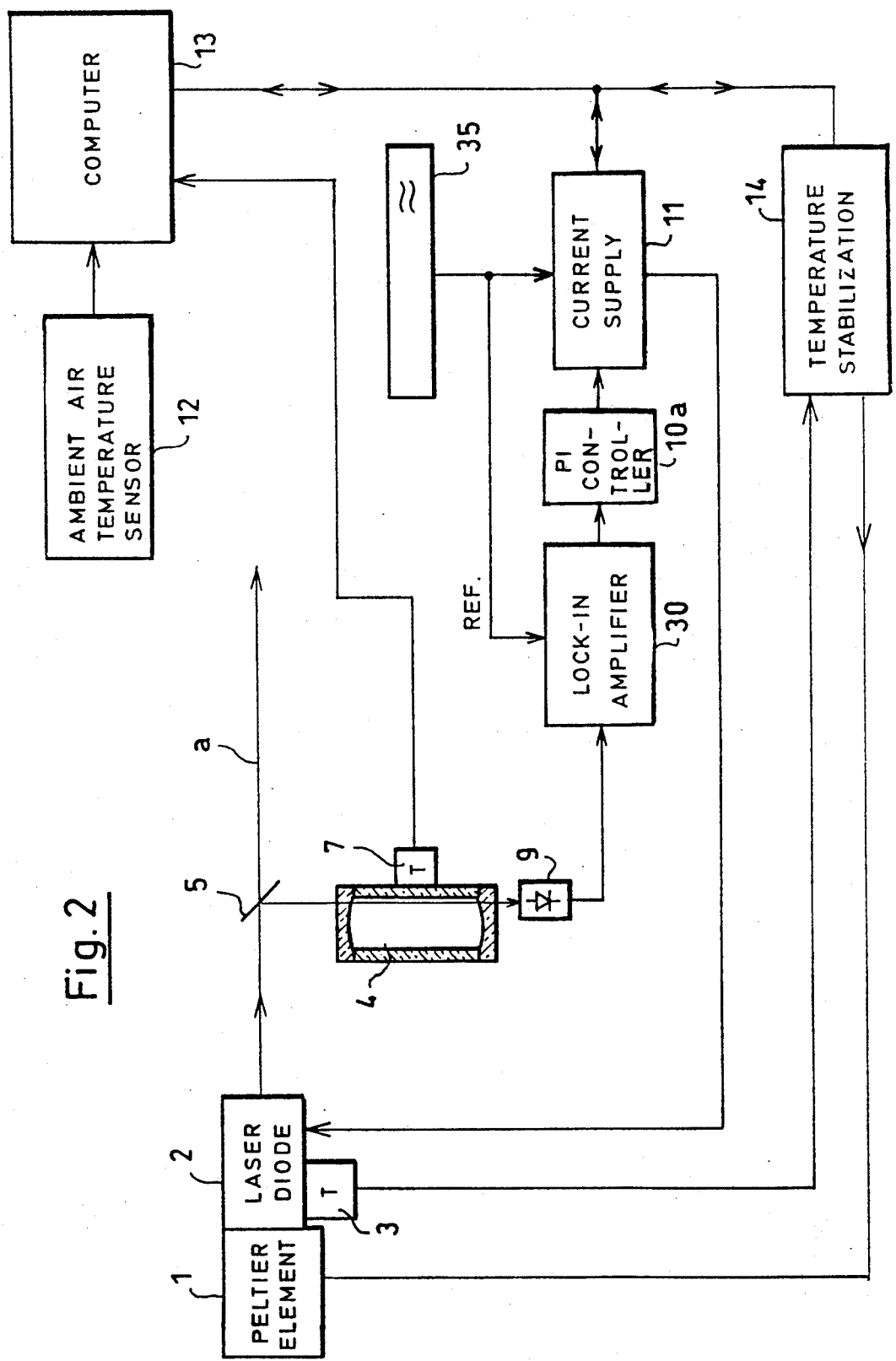

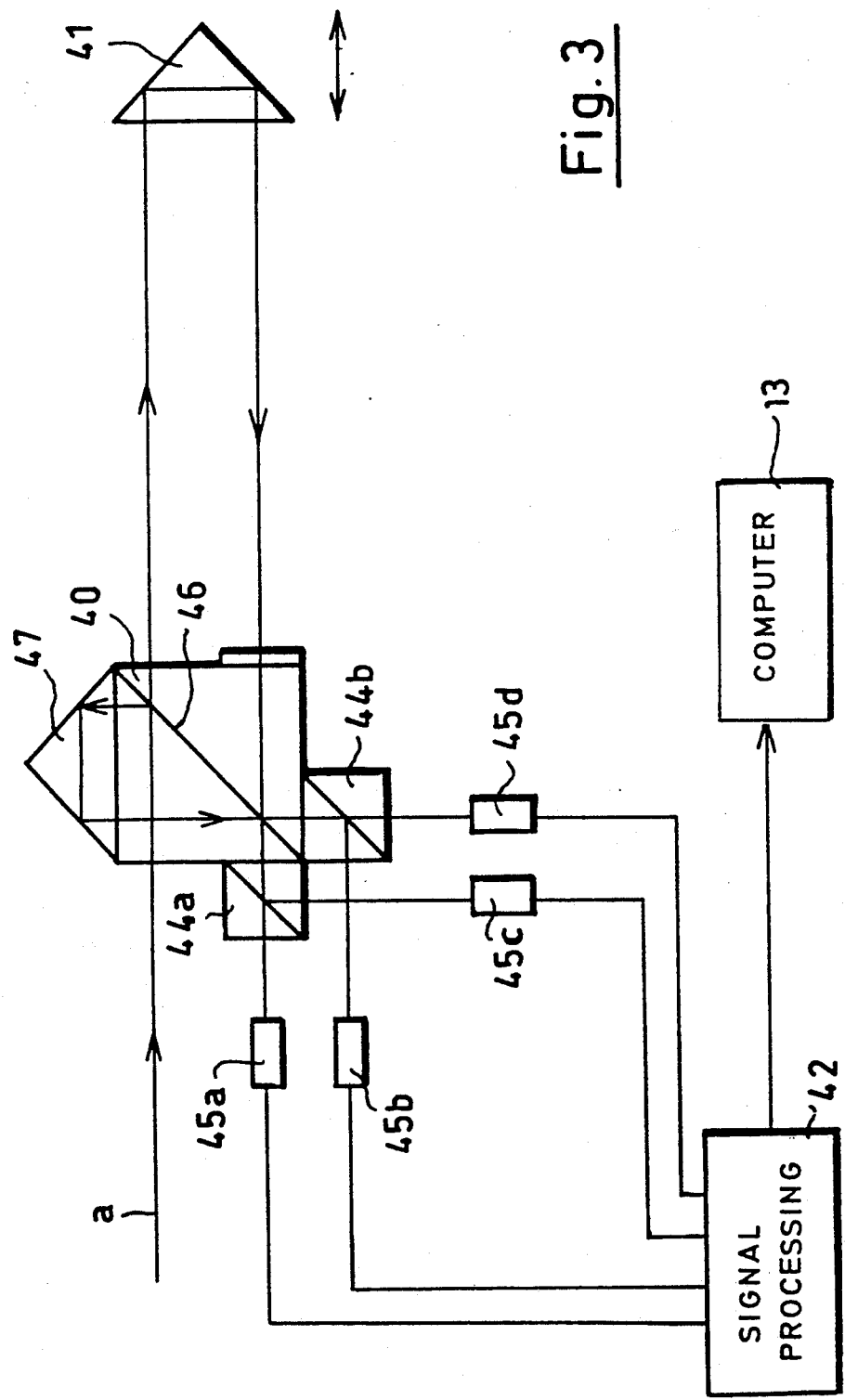

ARRANGEMENT FOR OPERATING A LASER DIODE

FIELD OF THE INVENTION

The invention relates to an arrangement for operating a laser diode as a radiation source in an interferometer for distance measurements.

BACKGROUND OF THE INVENTION

It has already been suggested to stabilize the wavelength of laser diodes by stabilizing their operating parameters and by additionally tying to a wavelength reference such as a Fabry-Perot interferometer. A suitable stabilization is the precondition that laser diodes maintain the wavelength stability of $10^{-7}$ or better required for many applications such as in communications technology or in metrology.

The current and the temperature of the laser diode have a relatively great influence on the emitted wavelength and this current and temperature are, as a rule, held as constant as possible to achieve the stabilization. In addition to the stabilization of these parameters, a part of the radiation emitted by the laser diode is supplied to a Fabry-Perot interferometer with a detector being connected downstream thereof which measures the intensity passing through the Fabry-Perot interferometer. Mostly, the current and therefore the wavelength of the laser diode is modulated and the signal of the receiver downstream of the Fabry-Perot interferometer is detected with a lock-in amplifier which measures the component of the receiver signal which oscillates at the modulation frequency. The output signal of the lock-in amplifier is then a measure for the deviation of the center wavelength of the laser diode from the central wavelength of the transmission maximum of the Fabry-Perot interferometer and can be used for readjusting the diode current and therefore the wavelength which the laser diode emits. In this way, the wavelength of the laser diode can be stabilized much better than only with a so-called parameter stabilization holding the current and temperature constant. Such an arrangement is shown, for example, in published German patent application DE 35 42 090.

For a reliable operation of such an arrangement, it is however necessary that the transmission maximum of the Fabry-Perot interferometer, onto which the control circuit locks in the wavelength of the diode laser, lies in a stable range within a mode of the laser diode and that, during the operation of the laser diode, no mode jumps occur. For this purpose, an electronic circuit is provided in the above-mentioned German patent application which automatically selects a suitable transmission maximum of the Fabry-Perot interferometer to which it is intended to stabilize. For this purpose, the current and temperature of the laser diode are first varied in order to pass through a region free of mode jumps. Then, when a transmission maximum of the Fabry-Perot interferometer is detected in this region, the wavelength emitted by the laser diode is locked onto this transmission maximum.

This known arrangement is well suited for applications such as in communications technology wherein the wavelength is stabilized with high accuracy but most importantly with respect to short term fluctuations, that is, relative wavelength changes. This arrangement is not suitable for applications in distance measurement technology since it is there necessary to stabilize the wavelength of the laser diode to the same precisely defined wavelength again and again. With reference to the above-mentioned arrangement, this leads to the requirement that the stabilization always and repeatedly locks into the same transmission maximum of the Fabry-Perot interferometer since the position of this transmission maximum determines the wavelength emitted by the laser diode and therefore also the reference wavelength with which the interferometer used for distance measurement operates.

For this last mentioned application, the paper of F. Crosdale et al entitled "Wavelength Control of a Diode Laser for Distance Measuring Interferometry" published in the proceedings of the SPIE, Vol. 1219, "Laser-Diode Technology L. and Applications II" (1990), pages 490 to 503, describes a stabilization arrangement wherein the wavelength of the laser diode is stabilized absolutely at $10^{-6}$ F. Crosdale et al utilize for this purpose a Fabry-Perot etalon which furthermore has a temperature stabilized to 0.01° C. in addition to the temperature stabilization of the laser diode. Under these conditions and because of the small thickness of 3 mm of the etalon, only very few transmission maxima of the etalon lie in the region of a selected mode in which the laser diode emits, it can be reasonably ensured that the same transmission maximum of the etalon is always approached and therefore the stabilization takes place to an absolute wavelength.

However, the foregoing is no longer the case where a so-called confocal Fabry-Perot interferometer is intended to be used for stabilization. Such confocal Fabry-Perot interferometers are insensitive with respect to adjustment and the position of the transmission maximum is not dependent upon the angle with respect to the beam axis as with the etalon. Such confocal Fabry-Perot interferometers have as a rule dimensions which are very much larger than with etalons. Correspondingly, at a center wavelength of approximately 830 nm, very many transmission maxima occur in the region of a mode of the laser diode. Within a mode, the wavelength can be changed with current and temperature. The coverable range is 0.5 nm with regions of typically 5 mA and 2 K in magnitude and gradients of $6 \times 10^{-3}$ nm/mA or $6 \times 10^{-2}$ nm/K. When the Fabry-Perot interferometer has a length of approximately 30 mm, then there are approximately 20 transmission maxima within a mode of which the correct one must be selected, when, after each switch-on and switch-off of the laser diode, always exactly the same wavelength is to be absolutely adjusted.

SUMMARY OF THE INVENTION

The above problem has not been solved previously with the arrangements referred to. Accordingly, it is an the object of the invention to stabilize the wavelength of a laser diode to an exactly defined value for its use in distance measuring interferometers.

The above object is achieved with the arrangement according to the invention for the operation of a laser diode as a radiation source in an interferometer for making distance measurements. The arrangement includes: a stabilization circuit by which desired values are preset for the temperature and current of the laser diode during operation; a control circuit which readjusts the current or the temperature of the laser diode in dependence upon a reference signal which is derived from the transmission characteristic of a Fabry-Perot interferometer; the spectral spacing of the transmission maxima of the Fabry-Perot interferometer is very much less than the spacing of the longitudinal modes emitted by the laser diode; sensors which measure the operating parameters of the laser diode (current, temperature) and which are connected to a control computer; coefficients are stored in the memory of the control computer by which the dependence of the wavelengths emitted by laser diode is defined upon the operating parameters and the environmental parameters; and, a control program which can be called up when the arrangement is switched on and, proceeding from the values of the operating parameter last measured and considering the environmental parameters and the coefficients, new values for the operating parameters are computed with which the wavelength of the laser diode is always matched to a pregiven transmission maximum of the Fabry-Perot interferometer.

With the combination of these measures, the condition is obtained that with every switch-on, the wavelength of the laser diode automatically always is again adjusted to an exactly defined value which is absolutely necessary for applications in length measuring technology. The Fabry-Perot interferometer utilized as a reference can be a confocal Fabry-Perot interferometer which is insensitive to adjustment. It furthermore requires no temperature stabilization when, for example, it is made from a material such as Zerodur. The linear expansion of Zerodur is practically zero when this material is used as a spacer for the concave mirror of the confocal Fabry-Perot interferometer.

If another material is used in lieu of a material having a linear expansion of zero, the temperature of the Fabry-Perot interferometer can be measured and the wavelength shift produced because of the thermal linear expansion is added to the measured distance measurement values.

BRIEF DESCRIPTION OF THE DRAWINGS

The invention will now be described with reference to the drawings wherein:

FIG. 2 is a simplified block diagram of another embodiment of the invention as an alternative to the embodiment in FIG. 1a;

FIG. 3 is a simplified schematic of a interferometer for distance measurements which is driven by an arrangement according to FIG. 1a or FIG. 2.

DESCRIPTION OF THE PREFERRED EMBODIMENTS OF THE INVENTION

Figure 1A:
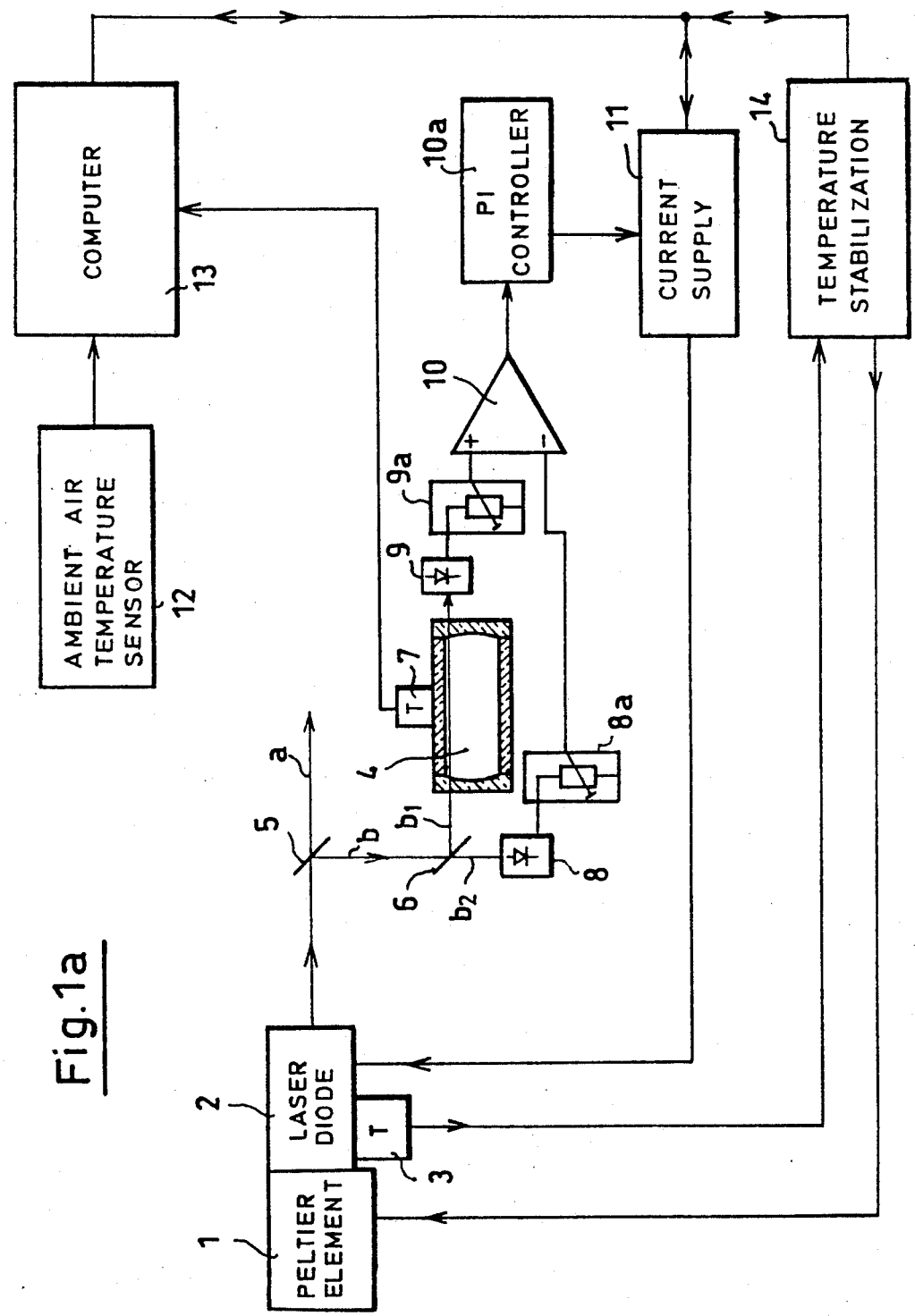
FIG. 1a is a block diagram showing the optical part and the essential components of the electronics of a first embodiment of the arrangement according to the invention.

In FIG. 1a, the laser diode is identified by reference numeral 2 the wavelength of which is to be absolutely stabilized. The beam emitted by the laser diode 2 is split into two component beams with a beam splitter 5 mounted downstream of the laser diode. The first component beam (a) passing through the beam splitter 5 supplies the distance measurement interferometer shown in FIG. 3. The split-off second component beam (b) is split once again by a second beam splitter 6 into a component beam b1 and a component beam b2 which impinges upon a photoelectric detector 8. The component beam b1 passes through a Fabry-Perot interferometer 4 and impinges thereafter on a second photoelectric detector 9.

The two photoelectric detectors 9 and 8 are connected to the input of an amplifier 10 as a differential circuit having an output which supplies the control signal as will be described hereinafter. The control signal stabilizes the wavelength of the laser diode 2. For this purpose, the output signal of the amplifier 10 is connected via a PI controller 10a to the current supply 11 for the laser diode 2.

The laser diode 2 is applied together with a Peltier element onto a substrate and is in thermal contact therewith. At the same time, the temperature of the laser diode is measured via a temperature sensor 3 mounted in the housing of the laser diode. The temperature sensor 3 and the Peltier element 1 are both connected to a temperature stabilizing circuit 14.

The two circuits 11 and 14 maintain the parameters current and temperature, respectively, of the laser diode constant (parameter stabilization).

The photoelectric detectors 8 and 9 and the differential amplifier 10 are part of a control circuit which, in addition to the above-mentioned parameter stabilization, ensures that the emitted wavelength of the laser diode 2 is tied to a transmission maximum of the Fabry-Perot interferometer 4. In the described embodiment, the stabilization is undertaken with respect to the flank of a transmission maximum of the Fabry-Perot interferometer 4. For this purpose, current/voltage converters 8a and 9a are connected downstream of the two photoelectric detectors 8 and 9, respectively. The current/voltage converters 8a and 9a are so adjusted that the signal coming from the diode 9 at the central wavelength, that is in the maximum pass-through range of one of the transmission maxima of the Fabry-Perot interferometer, is twice the height of the signal coming from the diode 8 which detects the reference beam b2.

The control signal of the differential amplifier 10 is superposed on the circuit (not shown) in the current supply 11 which presets a desired value for the operating current through the laser diode 2. In this way, the control loop described above provides that stabilization always takes place to a flank of a Fabry-Perot interferometer transmission peak. The circuit of the differential amplifier 10 provides that the flank of the transmission peak is selected which lies at higher current. In this way, an overdrive of the laser diode 2 is even then precluded when the control should for any reason become unlocked. In this case, the control reduces the current either until a transmission maximum is again found or the controller comes up against the limit at low current.

The current supply 11 for the laser diode 2 as well as the stabilization circuit 14 for the Peltier element 1 are connected via a data line to a computer 13. To this computer, two sensors 7 and 12 are connected which measure the temperature of the Fabry-Perot interferometer 4 and the air temperature, respectively. Knowing these environmental parameters becomes important for the operation of the stabilization arrangement as will be shown hereinafter. The air pressure is measured as required since the length of the Fabry-Perot interferometer is dependent thereon.

The computer 13 can, for example, be the host computer of a coordinate measuring apparatus having interferometers of the type shown in FIG. 3 built into the measuring axes of the apparatus for the measurement of the displacement distances of the movable parts of the apparatus.

Distance measuring interferometers of the kind shown in FIG. 3 are known per se and it is therefore necessary to only describe them here briefly. These interferometers generally comprise a beam splitter 46 having a splitter face which splits the incident beam (a) of the radiation source. The triple prism 47 is cemented to the beam splitter 46 and defines the reference path. The beam (a) is split into first and second component beams. The first component beam is deflected in the triple prism 47 and the second component beam is deflected in a triple prism 41 mounted to a movable part and thereafter the two component beams are rejoined at the splitter face. The component beams interfering at the splitter face are again split by two beam splitters 44a and 44b and impinge on four photoelectric detectors 45a to 45d which convert the interference image into phase-shifted electric signals. The electric signals are supplied to a signal processing unit 42 wherein the black-white transitions occurring as a consequence of the interference are counted with the movement of the deflecting prism 41 and the distance travelled is computed from these increments. The index of refraction of the ambient medium is to be considered in this context.

Figure 1B:
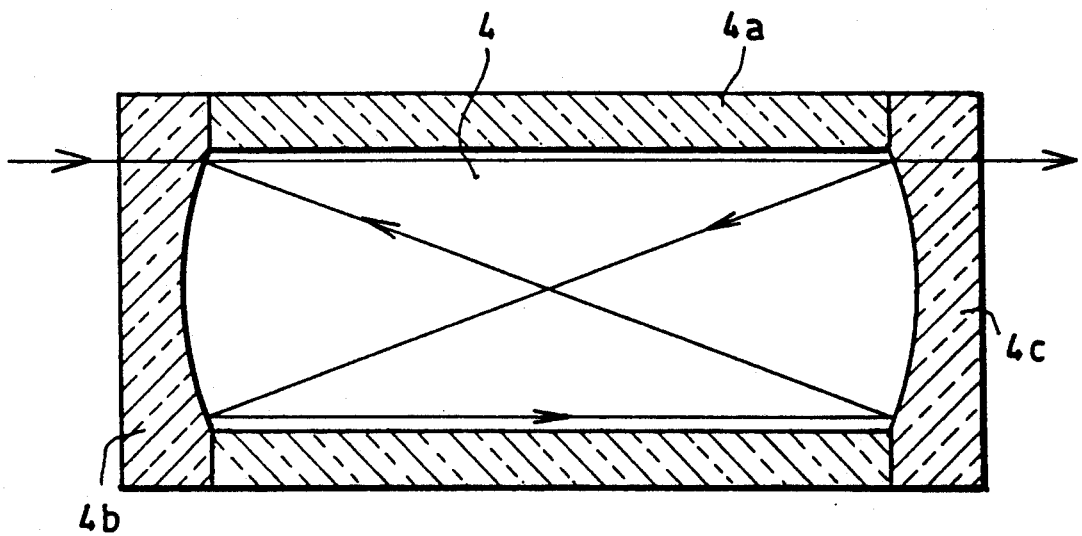
FIG. 1b is section view of the confocal Fabry-Perot interferometer of FIG. 1a at an enlarged scale.

The Fabry-Perot interferometer 4 in FIG. 1a is of the confocal type and, as shown enlarged in FIG. 1b, comprises a cylindrical spacer 4a made of a material having a low thermal linear expansion and two partially transmitting mirrors made, for example, of the quartz glass Homosil. The two transmitting mirrors (4b, 4c) are in optical contact with respective ends of the spacer 4a as shown. In a confocal Fabry-Perot interferometer of this kind, the measurement beam b1 used for the control enters off center and after four reflections on the mirror surfaces exits again coaxially because the curvature center points of the mirror surfaces each lie on the apex plane of the opposite-lying other concave mirror. The interior of the Fabry-Perot interferometer 4 is evacuated.

The Fabry-Perot interferometer utilized has typically a finesse of 17 and a free spectral range, that is, a spacing of its transmission maxima of 0.0078 nm at a wavelength of the laser diode of 790 nm.

A diode, for example, of the type HL 7801 of the Hitachi Company is selected as the laser diode. This diode radiates in dependence upon its operating temperature and the current, at which it is operated, in a wavelength range of between approximately 782 and 786 nm. In the temperature range between 15° and 22° and currents between 50 mA and 65 mA, the wavelength characteristic of such a diode exhibits many mode plateaus between which mode jumps of a multiple of the longitudinal mode spacing of approximately 0.3 nm occur. Within a mode plateau, the wavelength of the laser diode changes with temperature and current by approximately 0.06 nm/K and 0.006 nm/mA, respectively.

The free spectral range of the Fabry-Perot interferometer, that is the spacing of its transmission maxima of 0.0078 nm, thereby corresponds in order of magnitude to a wavelength difference of the laser diode which is produced by current changes of approximately 1 mA or temperature changes of 0.1 K. For this reason, the two parameters of current and temperature are adjusted by the circuits 11 and 14, respectively, with the corresponding precision.

The wavelength of the laser diode 2 however is still slightly dependent upon the air temperature in the ambient notwithstanding the temperature stabilization. The reason for this is seen in that the laser diode 2 cannot be completely insulated with respect to its ambient and a temperature self adjusts on the semiconductor layer which lies somewhere between the temperature of the ambient and the temperature of the cooled substrate. For this reason, the sensor 12 is provided which measures the air temperature. Furthermore, a further temperature sensor 7 is mounted on the spacer 4a of the Fabry-Perot interferometer which measures the temperature of the interferometer. Spacing changes of the mirrors 4b and 4c of the Fabry-Perot interferometer 4 occur because of thermal linear expansion of the spacer 4a. These spacing changes influence the spectral position of the transmission maximum to which the control circuit locks the emitted wavelength of the laser diode 2. The sensors 7 and 12 for these two environmental parameters are likewise connected to the computer 13.

In the computer 13, the two above-mentioned and once determined coefficients ($d\lambda/dTD$ and $d\lambda/dID$) are stored. These coefficients define the dependence of the wavelength of the laser diode on its temperature and the current with which the diode is driven. In the memory of the computer 13, the coefficients $d\lambda/dTL$ and $d\lambda/dTF$ are stored in addition which define the dependence of the wavelength of the laser diode on the environmental parameter of air temperature and the dependence of the spectral position of the transmission maxima of the Fabry-Perot interferometer on the temperature of its spacer 4a.

The following will now describe how a reliable operation of the arrangement of FIG. 1 is obtained in the context of a stabilization to always the same exactly defined wavelength.

First, the characteristic field is recorded for the individual laser diode 2 which is utilized and the dependence of the wavelength of the laser diode on the operating current and the temperature is measured. These operating parameters $d\lambda/dTD$ and $d\lambda/dID$ are stored in the computer 13.

An operating point for the laser diode is then selected which lies as far away as possible from mode jumps. The laser diode is adjusted to this operating point by the adjusted values of operating current and that temperature to which the Peltier element 1 cools the substrate by means of the circuits 11 and 14. For this purpose, the desired values for current and temperature are supplied by the computer 13 to the current supply 11 and the temperature stabilization 14, respectively.

Then, the dependence of the wavelength of the laser diode 2 on the air temperature is determined and this coefficient $d\lambda/dTL$ is also recorded.

Then, a transmission maximum of the Fabry-Perot interferometer 4 is selected which lies in the vicinity of the adjusted operating point. For this purpose, the operating current of the laser diode 2 is varied in a narrow range until the control circuit locks onto the nearest flank of a transmission maximum. With the control switched on, the temperature of the Fabry-Perot interferometer 4 is varied and the dependence of the wavelength on the Fabry-Perot interferometer temperature is determined. This coefficient $d\lambda/dTF$ is likewise stored in the computer 13.

The stabilized laser diode 2 can now be used as a light source for interferometric measurements. The vacuum wavelength of the laser diode 2 results from the position of the flank of the selected transmission maximum of the Fabry-Perot interferometer 4.

Before the stabilization arrangement is switched off, for example at the end of a workday, the last values of the operating current ID, the air temperature TL measured by the sensor 12 and the temperature TF of the Fabry-Perot interferometer 4 measured by the temperature sensor 7 are stored by the computer 13. The temperature of the substrate which is adjusted by the temperature stabilization 14 can always be maintained at the same value, for example, at 20° C.

When the arrangement is switched on again, for example at the start of the next workday, the same operating current IV is not adjusted which was utilized on the previous day. Rather, the current IN is computed at which the laser diode 2 again locks onto the flank of the same transmission maximum of the Fabry-Perot interferometer. For this purpose, the measured environmental parameters of the new day TL and TF and the stored coefficients dλ/dTL and dλ/dTF are applied and the new current IN is computed and adjusted pursuant to the following equation:

$$IN = IV - d\lambda/dTL \cdot dID/d\lambda \cdot \delta TL + d\lambda/dTF \cdot dID/d\lambda \cdot \delta TF$$

A constant value is added to the computed current which in any event is not greater than the current difference which leads to the next transmission maximum of the Fabry-Perot interferometer 4, for example, a current which is greater by 0.3 mA than the computed current IN. When the control circuit is now switched on with this current value, it controls automatically to the correct transmission maximum, that is the flank of the correct transmission maximum of the Fabry-Perot interferometer 4 lying at higher current, and there locks in since the fault occurring with switch-on has the correct sign.

In this way, the predetermined transmission maximum of the Fabry-Perot interferometer 4 is reliably found.

If now $\delta TF \neq 0$, that is when the wavelength of the predetermined transmission maximum of the Fabry-Perot interferometer 4 has become somewhat displaced because of the thermal linear expansion of the spacer 4a, then the wavelength emitted by the laser diode 2 does not correspond exactly to the wavelength with which the distance measuring interferometer of FIG. 3 is intended to operate. The error caused hereby in the distance measurements is corrected in that a correction is applied to all distance measurement values measured by the interferometer of FIG. 3 which have likewise been computed by the computer 13. This correction is performed by multiplying the distance measurement values by the coefficient dλ/dTF and the measured temperature deviation by δTF.

With the measures described, a wavelength stability of the laser diode 2 is obtained of better than $\pm 10^{-7}$ over several months.

In this embodiment, stabilization was performed on the flank of a transmission maximum of the Fabry-Perot interferometer 4 with the control circuit operating with the same signals, that is, the wavelength of the laser diode 2 does not have to be modulated.

It is however possible to undertake the stabilization to the central wavelength of a transmission maximum of the Fabry-Perot interferometer 4. This case is shown in FIG. 2.

In the embodiment of FIG. 2, the same components are provided with the same reference numerals as in FIG. 1 and are not described again. Changes with respect to the embodiment of FIG. 1 are concerned only with the area of the control circuit. Furthermore, the reference detector 8 and the second beam splitter 6 corresponding thereto in FIG. 1a can here be omitted.

In the embodiment of FIG. 2, the operating current of the laser diode 2 is modulated with a frequency of 2.5 kHz and an amplitude of 2 μA by a function generator 35 connected to the current supply 11. The signal of the photoelectric detector 9 arranged downstream of the Fabry-Perot interferometer 4 contains an alternating current signal on the modulation frequency having a negative or positive phase position when the output wavelength of the laser diode 2 lies on the right or left flank of the predetermined transmission maximum of the Fabry-Perot interferometer 4. The phase sensitive lock-in amplifier 30 connected downstream correspondingly supplies an output signal which can only be zero when the wavelength of the laser diode 2 corresponds to the center wavelength of the transmission maximum. The control circuit comprising the detector 9, the lock-in amplifier 30 and the current supply 11 draws the emitted wavelength of the laser diode to this center wavelength of the transmission maximum.

Departing from the method described with respect to FIG. 1a, the computed current IN according to equation 1 is adjusted in FIG. 2 when switching on and the current is passed through a range of ±0.3 mA about the computed value so that the control circuit can follow because of its time constants. During this pass through, the control circuit locks into the center wavelength of the transmission maxima of the Fabry-Perot interferometer 4.

It is understood that the foregoing description is that of the preferred embodiments of the invention and that various changes and modifications may be made thereto without departing from the spirit and scope of the invention as defined in the appended claims.

What is claimed is:

1. An arrangement for the operation of a laser diode as a radiation source in an interferometer for measuring distances, the arrangement comprising:

stabilization circuit means for providing desired values of current and temperature for said laser diode during operation;

a Fabry-Perot interferometer having a transmission characteristic from which a reference signal can be derived;

control circuit means including said Fabry-Perot interferometer and being adapted for readjusting the current and temperature of said laser diode in dependence upon a reference signal derived from said transmission characteristic;

said Fabry-Perot interferometer having a transmittance maximum defining a spectral spacing much less than the spacing of longitudinal modes emitted by said laser diode;

first sensor means for measuring a first operating parameter of said laser diode and providing a first sensor signal indicative of said first operating parameter;

second sensor means for measuring a second operating parameter of said laser diode and providing a second signal indicative of said second operating parameter;

third sensor means for measuring an environmental parameter and providing a third signal indicative of said environmental parameter;

control computer means connected to said first, second and third sensor means for receiving said first, second and third signals;

said control computer means including memory means for storing coefficients for defining the dependence of the wavelengths emitted by said laser diode upon said parameters; and, said control computer means being adapted to compute new values of said operating parameters when said arrangement is switched on with said new values being based on the last measured values of said operating parameters while considering said environmental parameter with the wavelength of said laser diode always being matched with said new values to a predetermined transmittance maximum of said Fabry-Perot interferometer.

2. The arrangement of claim 1, wherein said first and second operating parameters are the current and temperature, respectively, of said laser diode.

3. The arrangement of claim 1, said environmental parameter being air temperature; and, said arrangement further comprising fourth sensor means for measuring air pressure and providing a fourth signal indicative of said air pressure.

4. The arrangement of claim 3, said third sensor means being mounted on said Fabry-Perot interferometer for measuring the temperature thereof.

5. The arrangement of claim 1, said Fabry-Perot interferometer being of the confocal type wherein the ratio of the spacing of the transmittance maxima to the mode spacing of said laser diode is at least ten.

6. The arrangement of claim 3, wherein said control computer means is adapted to simultaneously process the distance measurement values of said interferometer for distance measurements and to use said third and fourth signals when computing the actual distances to correct the distance measurement values.

7. The arrangement of claim 1, wherein the control to the center wavelength of one of the transmittance maxima of said Fabry-Perot interferometer is undertaken.

8. The arrangement of claim 1, wherein the control to the flank of one of the transmittance maxima of said Fabry-Perot interferometer is undertaken.

9. The arrangement of claim 1, wherein said Fabry-Perot interferometer is evacuated.

10. The arrangement of claim 1, wherein said interferometer is built into a coordinate measuring apparatus for making distance measurements in at least one of the measuring axes of said apparatus.

* * * * *